United States Patent [19]

Unagami et al.

[11] Patent Number: 4,482,973
[45] Date of Patent: Nov. 13, 1984

[54] DIGITAL AUTOMATIC GAIN CONTROL CIRCUIT

[75] Inventors: Shigeyuki Unagami, Zama; Kuninosuke Ihira, Kawasaki; Takashi Kaku, Tama, all of Japan

[73] Assignee: Fujitsu Limited, Kawasaki, Japan

[21] Appl. No.: 393,120

[22] Filed: Jun. 28, 1982

[30] Foreign Application Priority Data

Jun. 30, 1981 [JP] Japan .................. 56-100534

[51] Int. Cl.³ .............................................. H03G 3/20
[52] U.S. Cl. .................................... 364/602; 364/157; 364/165; 364/182; 364/715; 330/278; 328/173
[58] Field of Search ............. 364/157, 164, 165, 602, 364/605, 715, 182; 330/278, 280; 328/173, 175

[56] References Cited
U.S. PATENT DOCUMENTS 3,983,381 9/1976 Jones, Jr. ........................... 364/514
4,191,995 3/1980 Farrow .............................. 364/157

Primary Examiner—Jerry Smith
Assistant Examiner—Allen MacDonald
Attorney, Agent, or Firm—Staas & Halsey

[57] ABSTRACT

A digital automatic gain control circuit provided with a first AGC loop and a second AGC loop; activated alternately. The first AGC loop is activated when an input signal is initially supplied. The loop produces a certain digital value calculated as an inverse number of the digital level of the input through predetermined digital arithmetic operations utilizing an approximation polynominal. The calculated digital value is then preset in certain portions of the second AGC loop. The second AGC loop starts operating by using said present value, then uses the digital level of the input itself, instead of the preset value, and produces an automatic gain controlled digital output. Utilizing said preset value as an initial input to the second AGC loop allows for rapid stabilization of the automatic gain controlled digital output.

5 Claims, 6 Drawing Figures

DIGITAL AUTOMATIC GAIN CONTROL CIRCUIT

BACKGROUND OF THE INVENTION

The present invention relates to a digital automatic gain control circuit.

As is well known, "automatic gain control" (AGC) is a function for maintaining a certain constant input level by smoothing out variations. Conventionally, the AGC function is achieved by means of an analog circuit such as an operational amplifier. However, recent progress in digital processing techniques has made it possible to achieve an AGC function by means of a digital circuit. Such a digital AGC circuit has already been proposed in, for example, Japanese Unexamined Patent Publication No. 50-45506 (1975).

In the digital AGC circuit, signals, appearing at each portion along an AGC loop thereof, can be obtained through digital arithmetic operations. Execution of the digital arithmetic operations by a high capacity processor has easily made possible high-speed operation which is impossible with conventional analog AGC circuits.

While such high-speed operation digital AGC circuits are now being used, they are still not always fast enough for the operation speed of high-speed operation systems such as data modems.

SUMMARY OF THE INVENTION

It is an object of the present invention to provide a high-speed operation digital AGC circuit able to cope with the above-mentioned high-speed operation systems.

In accordance with the above object, there is provided a digital AGC circuit having a first AGC loop and a second AGC loop which are activated alternately. The first AGC loop is activated when an input is initially supplied. The first AGC loop is a feedforward type AGC loop. It produces a weighting factor (AGC coefficient) corresponding to the input signal level, by calculating an approximation polynominal of its inverse value to keep the AGC output level constant. The second AGC loop is a feedback type AGC loop. It can be basically realized as a first order feedback loop by digital processing. The AGC coefficient calculated by the first AGC is then preset in the low pass filter of the second AGC loop. The second AGC loop starts operating by using the preset value. The digital input from an A/D converter and the output of a digital inverse number generator of the first AGC loop are applied to a digital multiplier as the multiplicand and the multiplier, respectively.

DESCRIPTION OF THE PREFERRED EMBODIMENT

Figure 1:
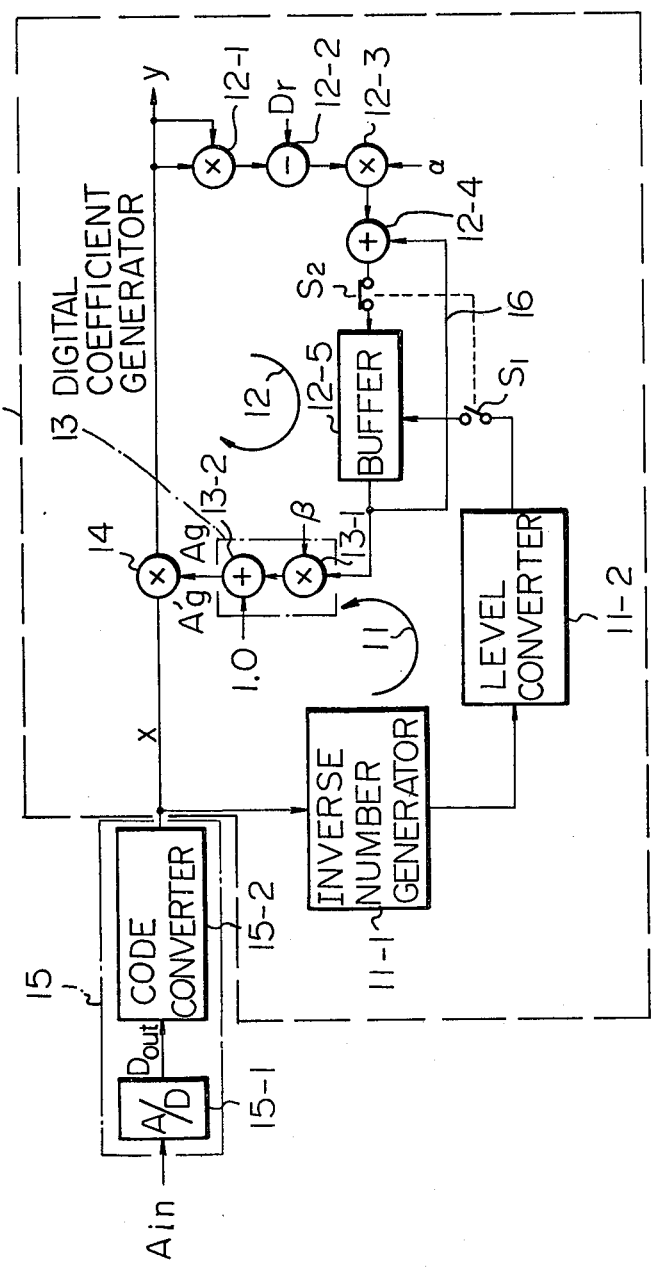
FIG. 1 is a block diagram of a digital AGC circuit according to the present invention.

FIG. 1 is a block diagram of a digital AGC circuit according to the present invention. A digital AGC circuit 10 includes therein a first AGC loop, represented by arrow 11, and a second AGC loop, represented by arrow 12. The first AGC loop 11 is comprised of a digital inverse number generator 11-1, a digital level converter 11-2, a first switch $S_1$ and a digital AGC coefficient generator 13. The second AGC loop 12 is comprised of a digital square circuit 12-1, a digital subtracter 12-2, a digital multiplier 12-3, a digital adder 12-4, a second switch $S_2$, a digital buffer 12-5, and the digital AGC coefficient generator 13, which is common to that of the first AGC loop 11. The digital AGC coefficient generator 13 is comprised of a digital multiplier 13-1 and a digital adder 13-2.

The analog input $A_{in}$ to be automatic gain controlled is applied to an analog-to-digital (A/D) converter 15. The digital input x from the A/D converter 15 and the output of the digital AGC coefficient generator 13 of the first AGC loop 11 are applied to a digital multiplier 14 as the multiplicand and the multiplier, respectively. The A/D converter 15 is preferably made of a companding A/D converter 15-1 and a digital nonlinear to linear code converter 15-2. The companding A/D converter 15-1 is useful for digital operations in the first and second AGC loops 11 and 12, because it can reduce the number of bits dealing with the wide dynamic range of the input signal. Specifically, the A/D converter 15-1 converts the analog input $A_{in}$ precisely into a corresponding digital code when the level of the input $A_{in}$ is relatively low. When the level of the input $A_{in}$ is considerably high, however, the A/D converter 15-1 converts the input $A_{in}$ coarsely so as to reduce the number of conversion bits.

Figure 2:
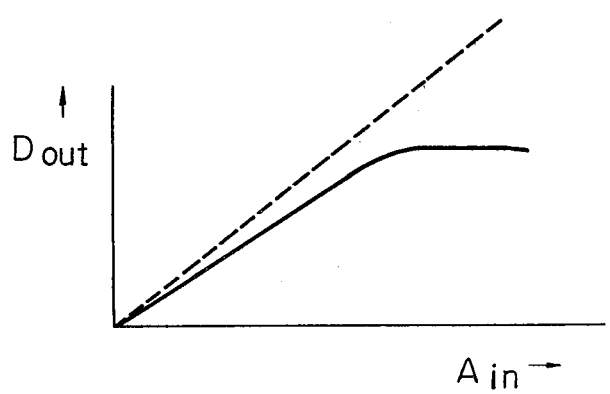
FIG. 2 is a graph used for explaining the companding operation of the converter 15-1 of FIG. 1.

FIG. 2 is a graph used for explaining the companding operation of the converter 15-1 of FIG. 1. In this graph, the abscissa indicates the level of the analog input and the ordinate indicates the value of the corresponding digital output $D_{out}$. As seen from the solid line curve, the higher the level of the analog input, the larger the suppression of the digital value of $D_{out}$, the suppression being proportional to the logarithm curve. In the graph, the dotted line curve represents the characteristics of usual linear analog-digital conversion.

The logarithm curve is obtained by using variable quantization levels. Accordingly, the value of the digital output $D_{out}$ must be modified so as to coincide with the value which would be obtained if constant quantization levels were used. This modification is effected by means of the above-mentioned digital linear code converter 15-2. The modified digital output $D_{out}$ is identical to the digital input x of FIG. 1.

Referring again to FIG. 1, the digital input x is applied to the digital multiplier 14. Digital multiplier 14 multiplies an automatic gain control coefficient Ag from the digital AGC coefficient generator 13 with the value of the digital input x to produce an AGC digital output y. That is, it performs the arithmetic operation y = Ag·x. The coeffcent Ag is defined, along the second AGC loop 12, by way of the members 12-1 through 12-4, $S_2$, 12-5, and 13.

The AGC digital output y is, on the one hand, provided as the desired AGC output and, on the other hand, applied to the digital square circuit 12-1 which is used to determine the instantaneous power of the AGC output. The digital output from the circuit 12-1 is supplied to the digital multiplier 12-3 via the digital subtracter 12-2. If the value of the output from the circuit 12-1 exceeds the value $D_r$, the output is applied to the multiplier 12-3 as a negative input. If the value of the output from the circuit 12-1 is lower than the value $D_r$, the output is applied to the multiplier 12-3 as a positive input.

The output from the subtracter 12-2 is weighted at the multiplier 12-3 by a predetermined weight factor $\alpha$. This muliplier 12-3, the adder 12-4, the conductive switch $S_2$, and the digital buffer 12-5, form a low pass filter acting as a digital averaging circuit. The output from the averaging circuit is applied to the generator 13 so as to produce the digital AGC coefficient Ag to be applied to the digital multiplier 14.

in the generator 13, the output from the digital buffer 12-5 is first weighted at the multiplier 13-1 by a predetermined weight factor $\beta$. Next, the weighted output from the multiplier 13-1 is further weighted at the digital adder 13-2 by a predetermined value such as 1.0.

Referring again to the above-mentioned digital averaging circuit (12-3, 12-4, $S_2$, 12-5), a closed loop, including the adder 12-4, the conductive switch $S_2$, the digital buffer 12-5, and the feedback path 16 create an integrator so as to achieve an averaging operation. Therefore, the buffer 12-5 functions as a digital delay circuit. When the analog input $A_{in}$ is initially supplied, it takes a short while before obtaining a stabilized AGC digital output y. In other words, it is difficult to obtain such stabilized output y immediately after the supply of initial input $A_{in}$. The delay time induced at the digital buffer 12-5 is inevitable.

However, this delay time can be minimized due to the presence of the first AGC loop 11 during the initial supply of the input $A_{in}$. The reason for this is that after a certain time, such as several ms, from the initial supply of $A_{in}$, the equation of $$y = Ag \cdot x \simeq K \tag{1}$$

stands, where K denotes a desired constant value of AGC (other symbols are the same as explained hereinbefore). Therefore, the value of Ag can be estimated by the equation:

$$Ag \simeq (K/x) \tag{2}$$

which is derived from the above equation (1). This estimation can be done very quickly every time the analog input $A_{in}$ is supplied, therefore the above-mentioned settling time of the AGC loop created in the above-mentioned integrator (12-4, $S_2$, 12-5, 16) can be minimized.

Although the estimated value of Ag(K/x) is not strictly the same as the real value of Ag, it may be very close. It is easy to obtain the estimated value of Ag (K/x) very quickly with the aid of a high speed arithmetic digital processor. The estimated value Ag is first produced in the first AGC loop 11. Next, the value of Ag is stabilized and reaches a correct value in the second AGC loop 12. Consequently, in FIG. 1, first the switch $S_1$ is made conductive (the switch $S_2$ is made nonconductive) so as to activate the first AGC loop 11. Then the switch $S_1$ is made nonconductive and the switch $S_2$ is made conductive so as to activate the second AGC loop 12.

In the present invention, two things are important. First, the estimated value of the digital AGC coefficient Ag is produced as the approximated inverse number of the level of the digital input x, as already mentioned above. The estimated value $A_g'$ of the digital AGC coefficient is defined by the following equation:

$$A_g' = k \cdot Ag \tag{3}$$

Since the approximate equation $Ag \simeq (K/x)$ stands, as is in equation (2), the following approximate equation is obtained.

$$A_g' \simeq (k \cdot K/x) \tag{4}$$

Initially, the coefficient $A_g'$ is applied to the multiplier 14 in the form of $(k \cdot K/x)$.

Second, the value of $A_g'$ is calculated by utilizing not a digital divider but an approximation polynominal to save the hardware for division. The value $A_g'$ can be so produced since the value $A_g'$ varies with respect to the variation of the value of the digital input x, which follows a hyperbolic function curve.

Figure 3:
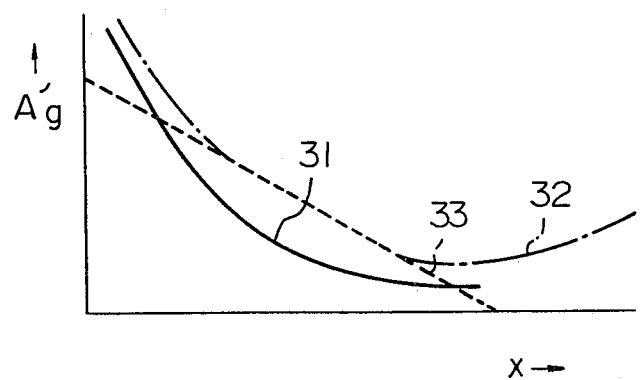
FIG. 3 is a graph used for explaining the relationship between the value of the digital input x and the value of the estimated AGC coefficient $A_g'$.

FIG. 3 is a graph used for explaining the relationship between the value of the digital input x and the value of the estimated digital AGC coefficient $A_g'$. As seen from the graph, the value of $A_g'$ varies with respect to the variation of the value of the input x which follows the solid line curve 31. The curve 31 is equivalent to the aforementioned hyperbolic function curve. According to a mathematical solution, the hyperbolic function curve 31 can be selectively approximated by a curve 32 indicated by chain-dotted line and a curve 33 indicated by a dotted line. The curve 32 can be represented by a second order approximation polynominal such as $ax^2 + bx + c$, where the symbols a, b and c denote respective predetermined coefficients. Further, the line 33 can be represented by a first order approximation polynominal such as $dx + e$, where the symbols d and e denote respective predetermined coefficients.

Thus, the arithmetic operation for obtaining the inverse number of the digital input x, that is (1/x), can equivalently be substituted by the arithmetic operation according to approximation polynominals including only addition and multiplication. Since a division operation is not required the estimated value $A_g'$ can be produced very quickly and easily.

Referring again to FIG. 1, the digital inverse number generator 11-1 produces the digital value of (1/x) in accordance with the aforementioned polynominal, such as $ax^2 + bx + c$, $dx + e$ or other proper equations. The resultant value of (1/x) is then preset in the buffer 12-5, via the first switch $S_1$ which is now conductive (the second switch $S_2$ is nonconductive). However, the resultant value of (1/x) from the generator 11-1 must not be preset directly in the buffer 12-5, but should be changed to a level which is suitable therefor. That is, suitable level conversion must be effected to the output (1/x) from the generator 11-1. This is why the digital level converter 11-2 is employed.

To be more specific, in the second AGC loop 12, the real coefficient Ag to be applied to the multiplier 14 is produced form the buffer 12-5 via the generator 13. Therefore, if the value from the buffer 12-5 is, for example, m, the value of Ag is defined as $Ag = m \cdot \beta + 1.0$ due to weight factors such as $\beta$ and 1.0 given in the generator 13. In other words, the value of the buffer 12-5 is converted to a level according to the above equation of $A_g = m \cdot \beta + 1.0$.

Similarly, in the first AGC loop 11, an equation of $A_g' = n \cdot \beta + 1.0$ should stand, where the symbol n denotes the level of (1/x) suitable for the buffer 12-5, the suitable level produced by the aforesaid level converter 11-2.

Namely, the purpose of the first AGC calculation is to obtain the value n for the buffer 12-5 utilizing the inverse number generator 11-1 and level converter 11-2.

Figure 4:
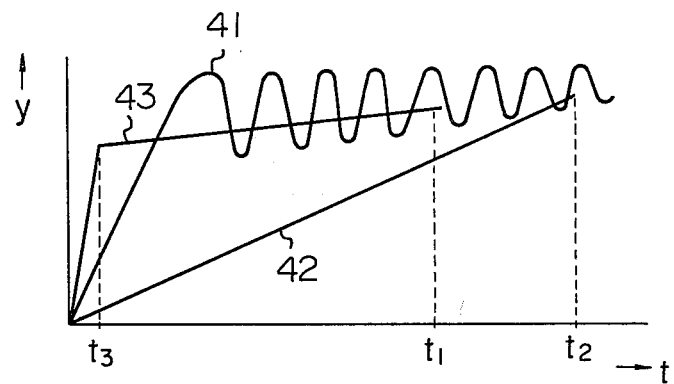
FIG. 4 is a graph used for explaining the variation of the AGC output y during the transient period of supply of initial analog input.

FIG. 4 is a graph used for explaining variations of the AGC output y during the transient period of suppying the initial analog input. In the graph, the ordinate indicates elasped time t and the abscissa indicates the level of the digital AGC output y shown in FIG. 1. Characteristics represented by curves 41 and 42 show two typical examples of transient periods obtained by using a conventional AGC circuit. As shown by the graph it takes a considerably long time, such as $t_1$ or $t_2$, which are for example, several dozen ms, to reach the stable state. In the AGC circuit according to the present invention, the output y quickly reaches close to saturation level at time $t_3$, for example, several ms, as shown by curve 43.

The above-mentioned explanations are made by using discrete hardware, however, it is actually preferable to obtain identical operations by using a digital processor under the control of software programs.

Figure 5:
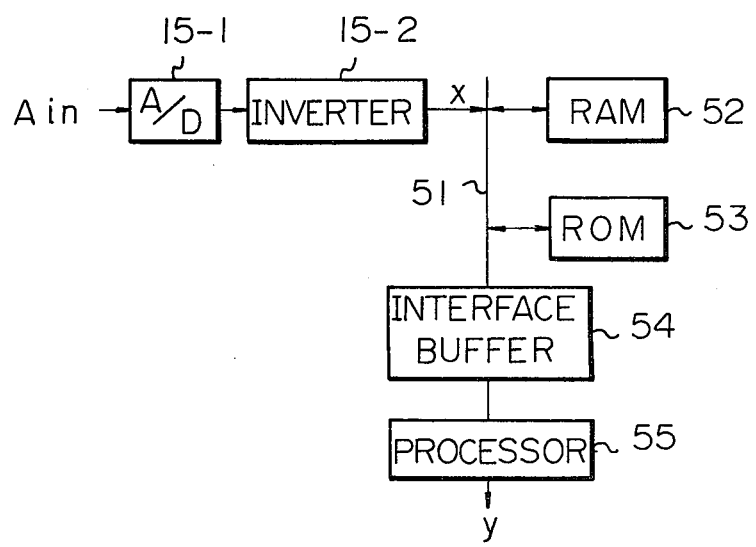
FIG. 5 is a block diagram of an example of a processing system adapted to achieve operations equivalent to those of the circuit shown in FIG. 1.

FIG. 5 is a block diagram of an example of a processing system adapted to achieve operations equivalent to those of the circiut shown in FIG. 1. The member $A_{in}$, x, 15-1, and 15-2 have already been explained. The digital input data x is stored by using a read only memory (ROM) 53, a random access memory (RAM) 52, and a processor 55 via a common bus 51 and an interface buffer 54. An initial digital input data x is momentarily stored in the RAM 52 which acts as a data memory. Then, the aforementioned arithmetic operations subjected to the polynominal $ax^2 + bx + c$, $dx + e$, or other proper polynomial equations, are achieved in the processor 55.

The resulting data from the arithmetic operations is stored, as is the estimated AGC coefficient value, in the RAM 52. This value corresponds to the value initially preset in buffer 12-5. In this case, the coefficients a, b, c, d, and e of the polynominals have already been stored in the ROM 53 acting as a coefficient data memory. The ROM 53 also stores the aforementioned values $\alpha, \beta$, +1.0, and $D_r$, $\alpha$ and $D_r$ will be used after the time $t_3$ of FIG. 4, so as to obtain the real AGC coefficient $A_g$.

Details of the above-mentioned operations are as follows. The digital input from the companding A/D converter 15-1 is further converted in a linear code form, by means of the digital linear converter 15-2, which code is suitable for executing fixed-point arithmetic operations. The thus coverted data of said digital input is stored in the RAM 52. The data is transferred, via the common bus 51, to the interface buffer 54 and to a multiplier and an accumulator in the processor 55. In the multiplier and the accumulator, the level of the digital input is quickly detected by adding up squared data, as follows:

(1) Data ($x_1$) is read from RAM 52 and then transferred to multiplier-multiplicand registers in the above-mentioned multiplier.

(2) The arithemetic operation of $x_1 \cdot x_1 = x_1^2$ is executed.

(3) The operations identical to the above items (1) and (2) are executed with respect to successive data $x_2$ through $x_N$. The multiplier executes accumulating operations. Thus, the resultant data $P_x$ is expressed by the equation $$x_1^2 + x_2^2 + x_3^2 + \ldots + x_N^2 = P_x.$$

(4) The resultant data $P_x$ is transferred to the multiplicand register. Simultaneously, the value of 1/N is read from the ROM 53 and then transferred to the multiplier register.

(5) A multiplying operation of $P_x \cdot (1/N)$ is executed. Accordingly, the resultant data $P_w$ is obtained as $P_x \cdot 1/N$. The data $P_w$, thus obtained, represents the short term power of said digital input x.

(6) The data $P_w$ is stored in the RAM 52. The estimated AGC coefficient $A_g$ (which has already been mentioned before) is calculated according to the approximation polynominals, that is, $$A_g' = a P_w^2 + b P_w + c \quad (\text{or } dx + e).$$

The coefficients a through e are read from the ROM 53. When the operation, for example, $aP_w^2 + bP_w + c$, is executed, the steps are as follows.

(7) The data $P_w$ is read from the RAM 52 and transferred to the multiplier and multiplicand registers. The data $P_w^2$ is thereby obtained through a simple multiplying operation.

(8) The data $P_w^2$ provided from the accumulator in the multiplier register is transferred again to the multiplier register. At the same time, the coefficient a is read from the ROM 53 and transfererd to the multiplicand register.

(9) The multiplying operation of $aP_w^2$ is momentarily stored in the accumulator.

(10) A similar multiplying operation is also effected with respect to the coefficient b and the data $P_w$.

(11) An adding operation + c is then achieved.

(12) The thus obtained $A_g'$ is preset in the digital buffer 12-5 after being converted to the level of n (already explained) via the level converter 11-2 shown in FIG. 1 under equation $n = (A_g - 1.0) \div \beta$, so that the first the data n is read from RAM 52 and the data "1.0" is read from ROM 53. These data are transferred to the multiplier and multiplicand registers, respectively.

(13) The data $(1/\beta)$ is read from the ROM 53 and transferred to the multiplier register.

(14) The data relating to $(A_g' - 1.0)$ is transferred to the multiplicand register.

(15) The inverse number of $\beta$, that is $1/\beta$, is read from the ROM 53 and is transferred to the multiplier register.

(16) The data $(A_g' - 1.0)$, obtained in the above step (12) and stored in the accumulator, is transferred to the multiplicand register.

(17) The data n is obtained through a simple multiplying operation by using data transferred in the above steps (15) and (16) $((A_g' - 1.0) \cdot 1/\beta)$.

(18) The resultant data n is stored in the RAM 52, equivalently, in FIG. 1, the data n is stored in the digital buffer 12-5.

(19) The data n is converted into the estimated AGC coefficient $A_g'$ through arithmetic operations equivalently executed in the AGC coefficient generator 13 in FIG. 1.

(20) The data $A_g'$ is multiplied by the digital input x through arithmetic operations equivalently executed in the multiplier 14 in FIG. 1.

(21) The resultant data from step (20), that is the digital output y, is squared in the multiplier, which is equivalent to the square circuit 12-1 in FIG. 1.

(B 22) The squared data from step (21) is subtracted from the aforesaid reference value $D_r$. The resultant data is weighted by the weight factor $\alpha$.

(23) The resultant data from step (22) is applied to an integrator, which is equivalent to the members 12-4, 12-5, and 16 in FIG. 1. Thereby, the real AGC coefficient Ag is obtained through operations equivalently executed by the generator 13 in FIG. 1. In this case, the aforesaid data n is not required until the coming set of analog inputs $A_{in}$ is supplied to the AGC circuit. The control of switching, equivalently executed by the pair of switches $S_1$ and $S_2$ in FIG. 1, can easily be achieved by a suitable software program.

Figure 6:
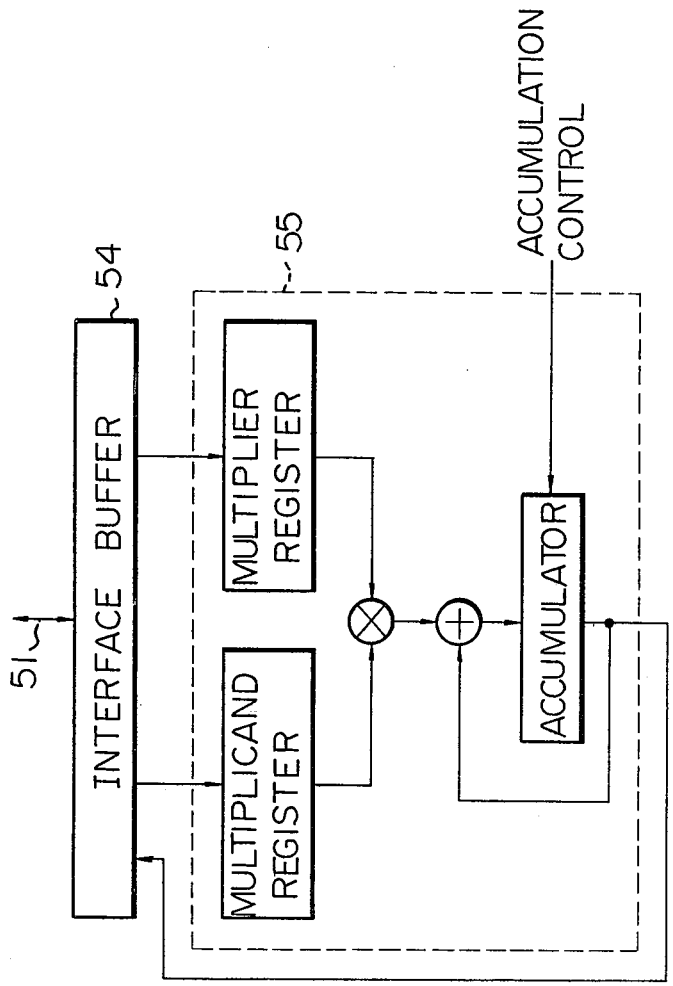
FIG. 6 is a detailed block diagram of the processor shown in FIG. 5.

The typical construction of the processor 55 is shown in FIG. 6.

The many features and advantages of the invention are apparent from the specification and thus it is intended by the appended claims to cover all such features and advantages of the system which fall within the true spirit and scope of the invention. Further, since numerous modifications and changes will readily occur to those skilled in the art, it is not desired to limit the invention to the exact construction and operation shown and described, and accordingly, all suitable modifications and equivalents may be resorted to, falling within the scope of the invention.

We claim:

1. A digital automatic gain control (AGC) circuit, comprising:
   an analog/digital converter, operatively connected to receive an analog input, for producing a corresponding digital input signal;
   a first AGC loop having a feedforward structure for producing an initial AGC coefficient, said first AGC loop comprising:
      a digital inverse number generator, operatively connected to said analog/digital converter, for receiving the digital input signal and generating an inverse number, said digital inverse number being calculated by using a predetermined approximation polynomial;
      a digital buffer having an output and operatively connected to said digital inverse number generator, for receiving, storing and providing said calculated digital inverse number;
      a digital AGC coefficient generator, operatively connected to said digital buffer, for receiving said calculated digital inverse number and for generating an output; and
      a digital multiplier, operatively connected to said digital AGC coefficient generator, for receiving said generated output and the digital input and outputting a digital AGC output;
   a second AGC loop, activated sequentially with said first AGC loop, having a feedback structure for producing a real AGC coefficient, said second AGC loop comprising:
      a digital square circuit, operatively connected to said digital multiplier, for receiving and full-wave rectifying said digital AGC output; and
      an integrator circuit operatively connected to said digital square circuit, comprising:
         a digital adder having an input operatively connected to said integrator circuit, an operatively connected to said digital buffer; and
         a feedback path forming a closed loop between the output of said digital buffer and the input of said digital adder;
      said digital AGC coefficient generator of said first AGC loop operatively connected to said digital buffer; and
      said digital multiplier, operatively connected to receive said output from said digital AGC coefficient generator and the digital input signal, for producing said digital ACG output.

2. A digital automatic gain control circuit as set forth in claim 1, wherein said analog/digital converter comprises:
   a companding analog/digital converter operatively connected to receive the analog input; and
   a digital linear code converter, operatively connected in series with said companding analog/digital converter, for receiving the analog input and producing the corresponding digital input signal.

3. A digital automatic gain control circuit as set forth in claim 2, wherein said digital inverse number generator comprises means for calculating the digital inverse number on the basis of a second order polynomial defined by $ax^2+bx+c$, and a first order polynominal, defined by $dx+e$, where the variable x is representative of the level of the digital input signal and the symbols a, b, c, d, and e indicate predetermined coefficients.

4. A digital automatic gain control circuit as set forth in claim 3, further comprising a digital level converter, operatively connected between said digital inverse number generator and said digital buffer, for receiving and changing the level of the digital inverse number to a suitable level for said digital buffer.

5. A digital automatic gain control circuit, having an analog input, comprising:
   an analog/digital converter, operatively connected to receive the analog input, for producing a corresponding digital input signal;
   a linear code converter, operatively connected to said analog/digital converter, for receiving and converting said digital input signal to a linear code form and outputting a converted digital input signal;
   a memory, operatively connected to said linear code converter, for receiving and storing said converted digital input signal;
   a processing circuit, operatively connected to said memory, for detecting the level of said converted digital input signal by reading said converted digital input signal from said memory, for performing an arithmetic operation and storing the level of said converted digital input signal in said memory, and for estimating an AGC coefficient by reading the level of said converted digital input signal from said memory, performing a multiplying operation and outputting an estimated AGC coefficient;
   a digital buffer, operatively connected to said processor circuit, for receiving and storing said estimated AGC coefficient; and
   means, operatively connected to said digital buffer and said linear code converter, for obtaining a real AGC coefficient in dependence upon the level of said converted digital input signal and said estimated AGC coefficient.

* * * * *

UNITED STATES PATENT AND TRADEMARK OFFICE
CERTIFICATE OF CORRECTION

PATENT NO. : 4,482,973
DATED : NOVEMBER 13, 1984
INVENTOR(S) : SHIGEYUKI UNAGAMI ET AL.

It is certified that error appears in the above-identified patent and that said Letters Patent is hereby corrected as shown below:

Col. 1, line 62, "Ag'" should be --A'g--.

Col. 4, line 7, "Ag'" should be --A'g--;

line 10, "Ag'" should be --A'g--;

line 16, "Ag'" should be --A'g--;

line 18, "Ag'" should be --A'g--;

line 20, "Ag'" should be --A'g--;

line 22, "Ag'" should be --A'g--;

line 23, "Ag'" should be --A'g--;

line 28, "Ag'" should be --A'g--;

line 29, "Ag'" should be --A'g--;

line 48, "Ag'" should be --A'g--.

UNITED STATES PATENT AND TRADEMARK OFFICE
CERTIFICATE OF CORRECTION

PATENT NO. : 4,482,973
DATED : NOVEMBER 13, 1984
INVENTOR(S) : SHIGEYUKI UNAGAMI ET AL.

It is certified that error appears in the above-identified patent and that said Letters Patent is hereby corrected as shown below:

Col. 5, line 5, "Ag'" should be --A'g--.

Col. 6, line 16, after "52.", start a new paragraph with "The";

line 21, "Ag'" should be --A'g--;

line 39, "Ag'" should be --A'g--;

line 48, "(Ag'" should be --(A'g--;

line 52, "(Ag'" should be --(A'g--;

line 58, "((Ag'" should be --((A'g--;

line 63, "Ag'" should be --A'g--;

line 66, "Ag'" should be --A'g--.

UNITED STATES PATENT AND TRADEMARK OFFICE
CERTIFICATE OF CORRECTION

PATENT NO. : 4,482,973

DATED : NOVEMBER 13, 1984

INVENTOR(S) : SHIGEYUKI UNAGAMI ET AL.

It is certified that error appears in the above-identified patent and that said Letters Patent is hereby corrected as shown below:

Col. 7, line 4, "(B22)" should be --(22)--.

Col. 8, line 2, "an" should be --and--.

Signed and Sealed this

Thirtieth Day of April 1985

[SEAL]

Attest:

DONALD J. QUIGG

Attesting Officer  Acting Commissioner of Patents and Trademarks